(12) United States Patent
Lee et al.

(10) Patent No.: US 12,261,098 B2
(45) Date of Patent: Mar. 25, 2025

(54) IMMERSION COOLING ELECTRONIC DEVICES

(71) Applicant: Hamilton Sundstrand Corporation, Charlotte, NC (US)

(72) Inventors: Yongduk Lee, Vernon, CT (US); Ankit Gupta, Willimantic, CT (US); Parag M. Kshirsagar, South Windsor, CT (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 268 days.

(21) Appl. No.: 17/889,511

(22) Filed: Aug. 17, 2022

(65) Prior Publication Data
US 2024/0063088 A1 Feb. 22, 2024

(51) Int. Cl.
*H01L 23/44* (2006.01)
*H01L 23/473* (2006.01)
(Continued)

(52) U.S. Cl.
CPC .......... *H01L 23/445* (2013.01); *H01L 23/473* (2013.01); *H05K 1/0203* (2013.01); *H05K 7/20236* (2013.01); *H05K 7/20272* (2013.01)

(58) Field of Classification Search
CPC .......... H05K 7/20236; H05K 7/20254; H05K 7/20263; H05K 7/20272; H05K 7/203; H05K 7/20318; H05K 7/20327; H05K 7/20336; H05K 7/20381; H05K 7/20418; H05K 7/20445; H05K 7/20772; H05K 7/208; H05K 7/20809; H05K 7/20818; H05K 7/20836; H05K 7/20872–20881; H05K 7/20927–20936; H05K 1/0203; H05K 1/0209; H05K 1/141; H05K 1/144; H05K 5/00; H05K 5/061; H05K 2201/042; H05K 2201/064; H01L 23/34; H01L 23/44; H01L 23/427; H01L 23/445; H01L 23/46; H01L 23/473; H03L 1/04
See application file for complete search history.

(56) References Cited

U.S. PATENT DOCUMENTS 4,649,990 A * 3/1987 Kurihara ............. H01L 23/3731
257/E23.113
5,471,844 A 12/1995 Levi
(Continued)

OTHER PUBLICATIONS

European Search Report dated Jan. 16, 2024 in connection with European Patent Application No. 23191420.1, 7 pages.

*Primary Examiner* — Amir A Jalali

(57) ABSTRACT

Embodiments have two approaches as follows: (1) Embedded PCB-based fabrication and (2) PCB assembly-based fabrication. An embedded printed circuit board (PCB) type approach involves the creation of a space of coolant direct interconnection, using immersion cooling to link on any type of power semiconductor device hot spots to convectively and evaporatively cool directly. This means fabricating PCB embedded channels, to utilize the microgap between die and PCB as the cooling channel. A printed circuit board (PCB) assembly embodiment includes a PCB having at least one heat generating component. A lid is mounted to the PCB, wherein the lid defines a cooling path therein extending in a coolant flow direction from an inlet end of the cooling path to an outlet end of the cooling path.

21 Claims, 4 Drawing Sheets

(51) Int. Cl.
    *H05K 1/02*           (2006.01)
    *H05K 7/20*           (2006.01)

(56) References Cited

U.S. PATENT DOCUMENTS

| | | | |
|---|---|---|---|
| 6,882,156 B2 * | 4/2005 | Hauptman | G06F 1/20 |
| | | | 361/699 |
| 7,727,807 B2 | 6/2010 | Han | |
| 8,269,341 B2 | 9/2012 | Barth | |
| 10,692,793 B2 | 6/2020 | Tuttle | |
| 10,834,853 B2 | 11/2020 | Tuttle | |
| 2006/0034052 A1 * | 2/2006 | Chang | H05K 7/20254 |
| | | | 361/697 |
| 2007/0076374 A1 * | 4/2007 | Mongia | H01L 23/473 |
| | | | 257/E23.098 |
| 2009/0109624 A1 | 4/2009 | Chan et al. | |
| 2013/0186109 A1 * | 7/2013 | Atrey | F28F 3/08 |
| | | | 29/890.035 |
| 2013/0258592 A1 * | 10/2013 | Brandenburg | H05K 7/20927 |
| | | | 361/699 |
| 2013/0314878 A1 * | 11/2013 | Ott | H05K 3/284 |
| | | | 361/728 |
| 2015/0109735 A1 * | 4/2015 | Campbell | H05K 7/2079 |
| | | | 361/700 |
| 2017/0229377 A1 * | 8/2017 | Ellsworth, Jr. | H01L 23/3737 |
| 2017/0325327 A1 | 11/2017 | Smith et al. | |
| 2021/0166991 A1 * | 6/2021 | Liu | G02B 6/12002 |
| 2022/0039252 A1 * | 2/2022 | Zhou | H05K 1/185 |
| 2022/0217845 A1 * | 7/2022 | Salmon | H01L 23/473 |
| 2022/0256692 A1 | 8/2022 | Weis | |
| 2023/0422452 A1 * | 12/2023 | Lee | H01L 23/3672 |
| 2024/0015881 A1 * | 1/2024 | Lee | H05K 1/0209 |

\* cited by examiner

IMMERSION COOLING ELECTRONIC DEVICES

STATEMENT REGARDING FEDERALLY SPONSORED RESEARCH OR DEVELOPMENT

This invention was made with government support under contract no. DE-AR0001404 awarded by the U.S. ARPA-E. The government has certain rights in the invention.

BACKGROUND

1. Field

The present disclosure relates to printed circuit boards (PCBs), and more particularly to cooling for heat generating components connected to PCBs.

2. Description of Related Art

Conventional approaches for cooling power electronics on PCBs include non-direct cooling methods such as using a cold plate to cool a device embedded inside a PCB, mounting a cold plate for top cooling a power device that is surface mounted to a PCB, and mounting a cold plate to the opposite side of a PCB from a surface mounted power device. These approaches typically lead to a high temperature gradient between an inlet coolant and a junction temperature due to the thermal resistance of multiple intervening layers of material. This makes it difficult to maintain proper case or package temperature for heat generating power electronics devices, e.g., GaN (Gallium Nitride) transistors or the like.

Solutions to this problem typically use 3D printing to provide channels for microfluids. However, these solutions require special fabrication techniques not normally used for PCB manufacturing. They also present challenges for how to connect other sub-circuits and how to mount passive components. Conventional embedded device PCB designs and heat pipes embedded in PCBs are not easy to make in a way that provides acceptable thermal performance and that is suitable for high power electronics.

The conventional techniques have been considered satisfactory for their intended purpose. However, there is an ever-present need for improved systems and methods for cooling PCBs. This disclosure provides a solution for this need.

SUMMARY

An embedded PCB with micro immersion cooling channel includes a PCB including at least one heat generating component. A cooling path extends in a coolant flow direction from an inlet end of the cooling path to an outlet end of the cooling path. The cooling path is in fluid communication with the at least one heat generating component.

A cryogenic coolant and non-conductive fluid can be included in the cooling path. A lid can be mounted to the PCB, wherein the lid defines the cooling path. The lid can include one or more additional PCBs assembled to the first PCB with vias, with the cooling path defined in an interior space bounded by the first, second, and third PCBs. The one or more additional PCBs can include a second PCB defining a perimeter wall about the cooling path, and a third PCB that includes an inlet and an outlet for the cooling path. The second PCB can be mounted to the first PCB. The third PCB can be mounted to the second PCB. The vias can extend from an exterior surface of the third PCB, through the third PCB, through the second PCB, and through the first PCB to an exterior surface of the first PCB.

The lid can include a unitary polymer element defining an inlet and an outlet for the cooling path. The lid can be sealed to the PCB with a seal element and wherein the lid is joined to the PCB with one or more fasteners. The one or more fasteners can each extend through the PCB and into the lid. The seal element can include Indium.

The PCB can be a first PCB with an embedded electronics device PCB (printed circuit board) packaging. A second PCB can defining a perimeter wall about the cooling path, which can include a micro cooling channel. A third PCB can include an inlet and an outlet for the cooling path. The second PCB can be sealed with a first seal element to the first PCB. The third PCB can be sealed to the second PCB with a second seal element, with the cooling path defined in an interior space bounded by the first, second, and third PCBs. The first and second seal elements can be laser cut. The first and second seal elements can include Indium.

The at least one heat generating element can include a die inside a package, wherein the die generates heat, and wherein the package is in direct fluid communication with the cooling path. The at least one heat generating element can include a die in direct fluid communication with the cooling path without an intervening package. The die can be embedded in the first PCB. The at least one heat generating element can include a die embedded in the PCB with a direct bonded coper (DBC) packaging intervening between the die and direct fluid commination with the cooling path.

The lid can include electronic devices mounted thereto. The PCB can include an electronic device, e.g., a capacitor, mounted to an external surface thereof, opposite an interior surface of the PCB that bounds the cooling path. The electronic device mounted to the external surface can be electrically connected to the at least one heat generating component. One or more vias through the PCB can electrically connect the at least one heat generating component to the electronic device mounted to the external surface.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
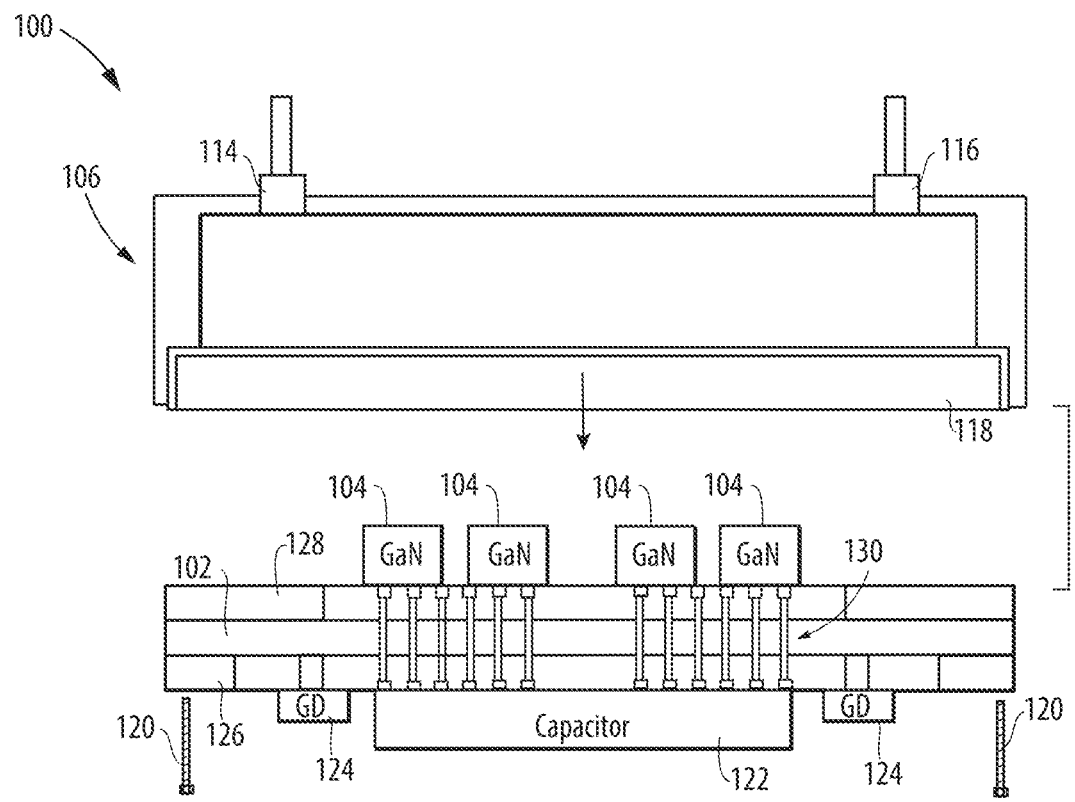
FIG. 1 is a schematic exploded cross-sectional side elevation view of an embodiment of a printed circuit board (PCB) assembly constructed in accordance with the present disclosure, showing a unitary lid.

Reference will now be made to the drawings wherein like reference numerals identify similar structural features or aspects of the subject disclosure. For purposes of explanation and illustration, and not limitation, a partial view of an embodiment of an assembly in accordance with the disclosure is shown in FIG. 1 and is designated generally by reference character 100. Other embodiments of systems in accordance with the disclosure, or aspects thereof, are provided in FIGS. 2-8, as will be described.

The systems and methods described herein can be used to provide an immersion cooling and high power semiconductor packaging, including cryogenic or non-conductive fluid, to electronic devices.

The printed circuit board (PCB) assembly 100 includes a PCB 102 including a plurality of heat generating components 104. A lid 106 is mounted to the PCB, wherein the lid 106 defines a cooling path 108 therein, labeled in FIG. 2, extending in a coolant flow direction, indicated by the flow arrow in FIG. 2, from an inlet end 110 of the cooling path 108 to an outlet end 112 of the cooling path 108.

Figure 2:
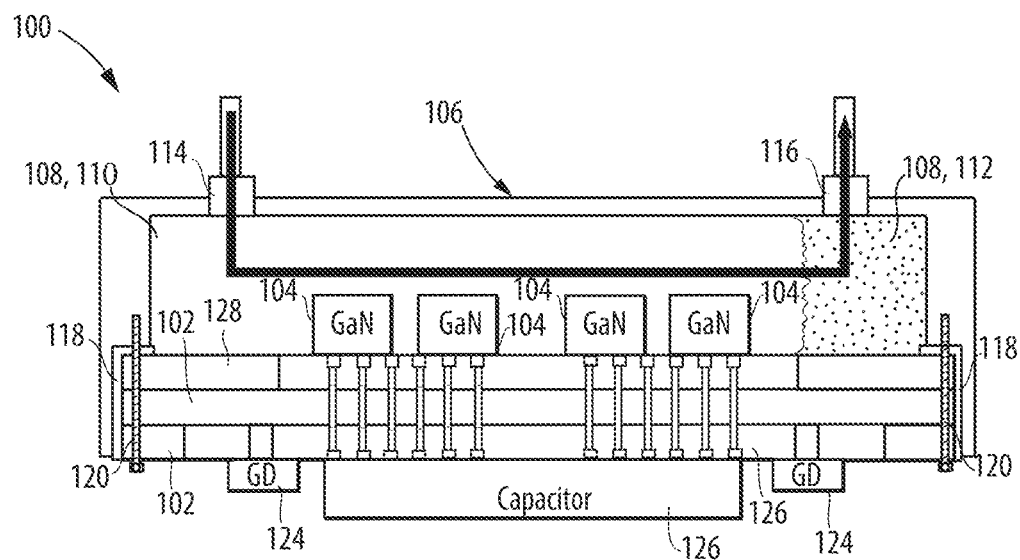
FIG. 2 is a is a schematic cross-sectional side elevation view of the assembly of FIG. 1, showing the lid assembled onto the PCB to enclose the cooling path.

With continued reference to FIGS. 1 and 2, the lid 106 includes a unitary polymer element defining an inlet 114 and an outlet 116 for the cooling path 108. The lid 106 is sealed to the PCB 102 with a seal element 118, which can include a soft metal such as Indium which is effective even for cryogenic coolants such as liquid Nitrogen of Bio-LNG (a liquefied natural gas), or any other suitable seal material. The lid 106 is joined to the PCB 102 with fasteners 120. The fasteners 120 each extend through the PCB 102 and into the lid 106.

The PCB 102 can include any suitable number of electronic devices, e.g., a capacitor 122 and other electronic components 124, mounted to an external surface 126 thereof, opposite an interior surface 128 of the PCB 12 that bounds the cooling path 108. The electronic devices 122, 124 can be electrically connected to the generating components 104, e.g. by way of one or more vias 130 through the PCB 102 from the external surface 126 to the interior surface 128 of the PCB 102.

Figure 3:
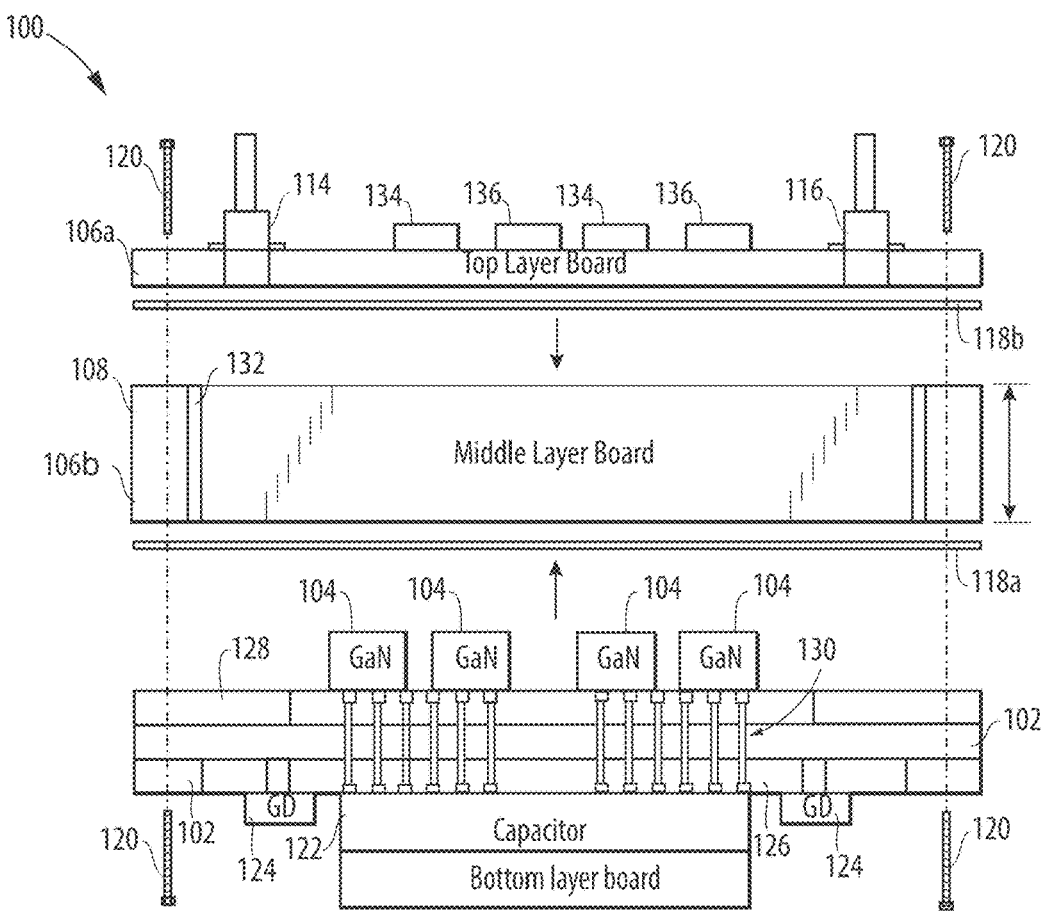
FIG. 3 is a schematic exploded cross-sectional side elevation view of an embodiment of a PCB assembly constructed in accordance with the present disclosure, showing a second and third PCB for forming a cooling channel and a lid, a top PCB includes passive components and an integrated electronics chip.
Figure 4:
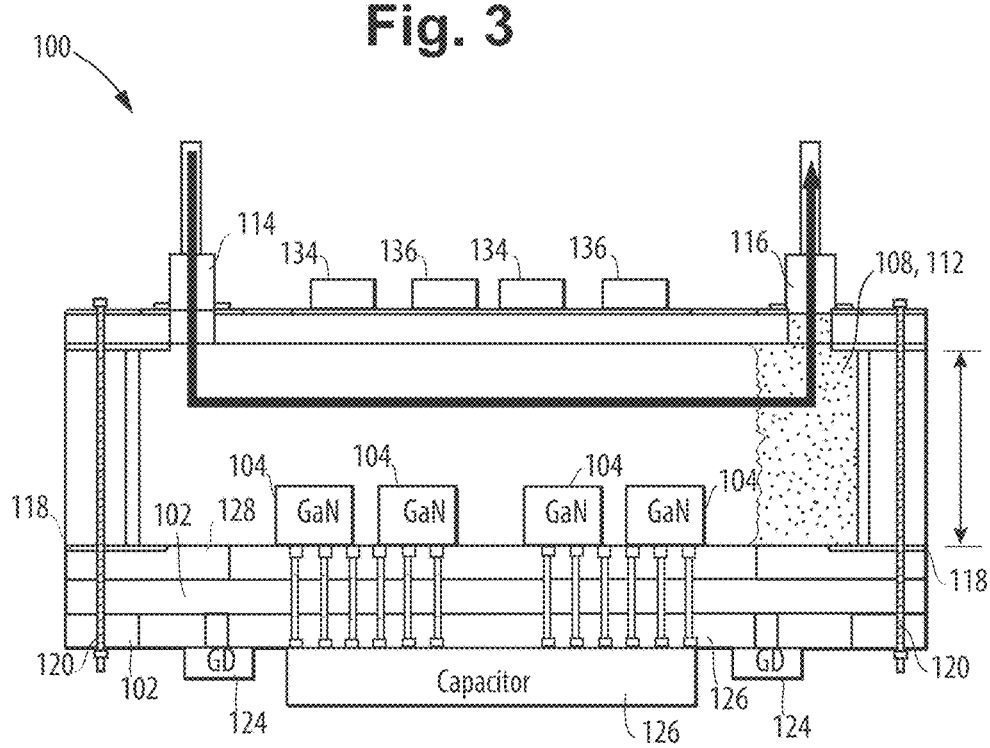
FIG. 4 is a is a schematic cross-sectional side elevation view of the assembly of FIG. 3, showing the lid assembled onto the first PCB to enclose the cooling path, a current flow path through PCB vias, and each surface pad soldering between bottom and top PCBs, in a multilayer PCB structure.

With reference now to FIGS. 3-4, another embodiment of the assembly 100 is shown, wherein the lid includes a second PCB 106a defining a perimeter wall with a copper interior lining 132 about the cooling path 108, and a third PCB 106b that includes the inlet 114 and the outlet 116 for the cooling path 108. The second PCB 106a is sealed with a first seal element 118a to the first PCB. The third PCB 106b is sealed to the second PCB 106a with a second seal element 118b. The seal elements 118a, 118b can be laser cut and can include an Indium or other suitable seal material. The cooling path 108 is defined in an interior space bounded by the first, second, and third PCBs 102, 106a, 106b. The lid optionally includes electronic devices 134 and/or passive components 136 mounted to an exterior surface of the third PCB that is not exposed to the cooling path 108. In addition, the assembly 100 can include PCB vias 138. Thus a conductive path can be used between the first PCB 102, and third PCB 106b and the second PCB 106a. The PCBs 102, 106a, 106b and seal elements 118a, 118b can be assembled together as shown in FIGS. 3-4 with fasteners 120 passing through respective bores all three PCBs 102, 106a, 106b, wherein the fasteners 120 are in fluid isolation from the cooling path 108.

Figure 5:
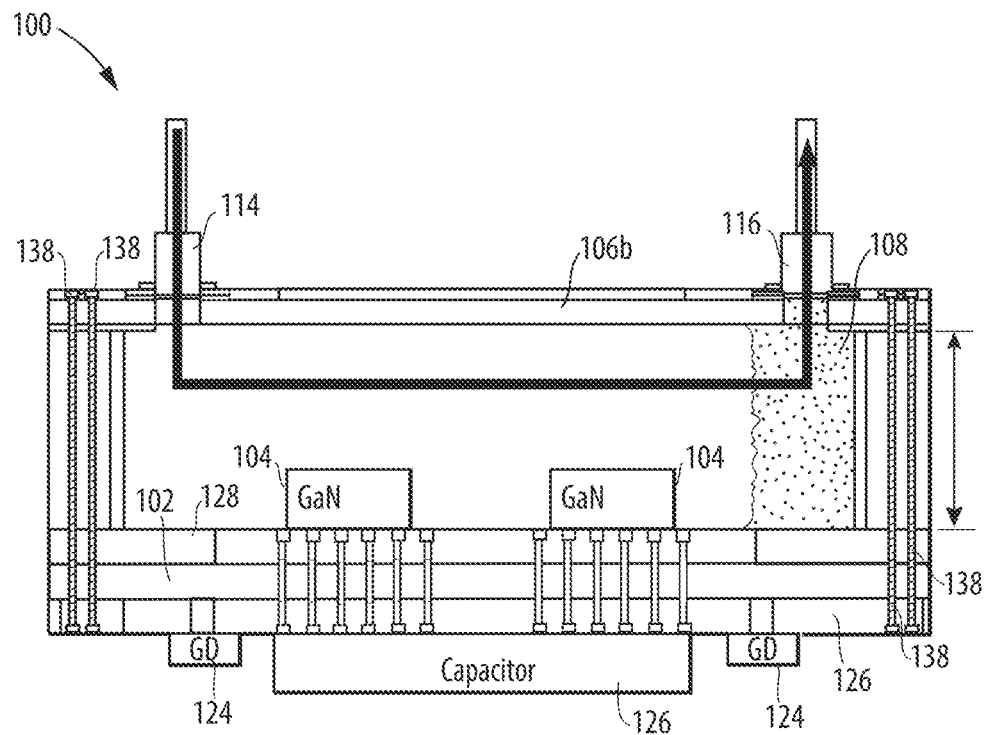
FIG. 5 is a schematic cross-sectional side elevation view of an embodiment of an embedded PCB with micro immersion cooling channel constructed in accordance with the present disclosure, showing a micro cooling channel formed of middle layer and all PCB layers with a current flow through path through PCB vias between the top and bottom layers.

With reference now to FIGS. 5, another embodiment of the embedded PCB with micro immersion cooling channel (assembly 100) is shown, where the embedded PCB includes second and third PCBs 106a, 106b much as described above with respect to FIGS. 3-4, but where the PCBs 102, 106a, 106b are fabricated together with an embedded PCB approach.

The embodiment in FIGS. 5-8 represents an embedded PCB-based fabrication. This places a target device, e.g. heat generating components 104, in a cryogenic coolant and non-conductive fluid, which enhances the cooling performance. This fabrication technique involves the creation of a space, e.g. cooling path 108, of coolant with direct contact, using immersion cooling to contact device hot spots to convectively and evaporatively cool the components 104. This can involve fabricating PCB embedded channels, and can utilize a micro gap between the component 104, e.g. a GaN die, and the PCB 102 as the cooling channel. The micro gap or space can be integrated into a cryogenic cooling and non-conductive fluid path, delivering chilled fluid to the component t 104 and extracting a mixture of heated liquid and vapor to be transported to an ambiently cooled radiator or the like. In addition, there are two more benefit as follows: (1) other PCB layers will be the thermal insulator for protecting other electronics devices and (2) through-hole vias can be used between bottom and top layers of the assembly 100 in FIGS. 5-8 (e.g. fasteners and seal later are not needed).

Figure 6:
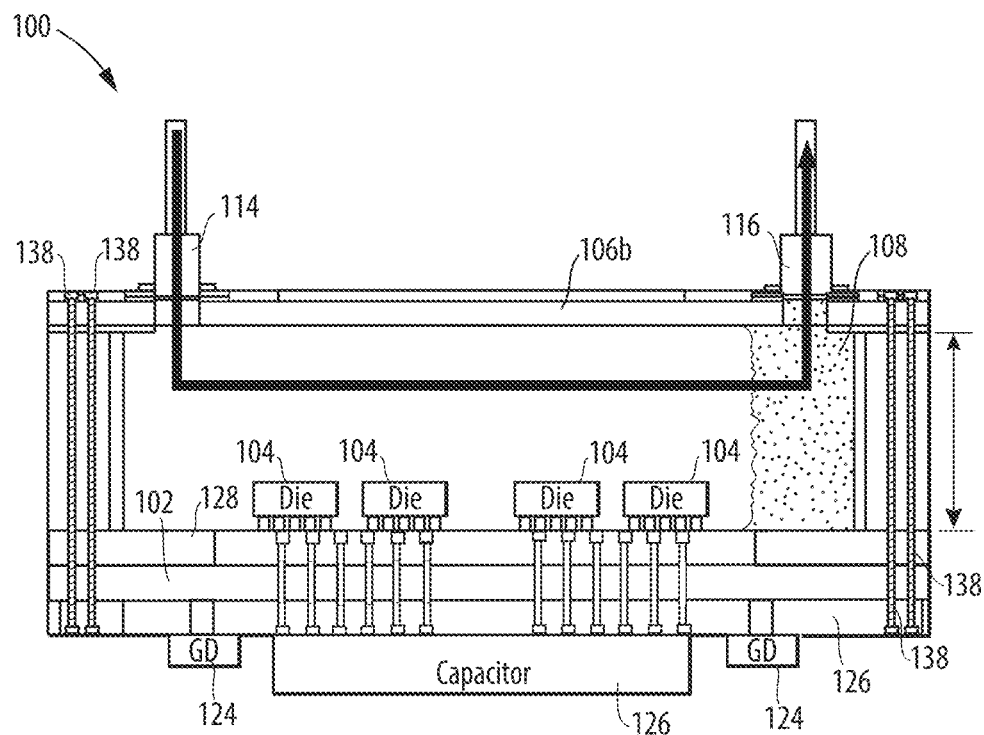
FIG. 6 is a schematic cross-sectional side elevation view of the embedded PCB with micro immersion cooling channel of FIG. 5, showing heat generating components that are dies directly in contact with coolant in the cooling path, and semiconductor package device attachment is also applicable.
Figure 7:
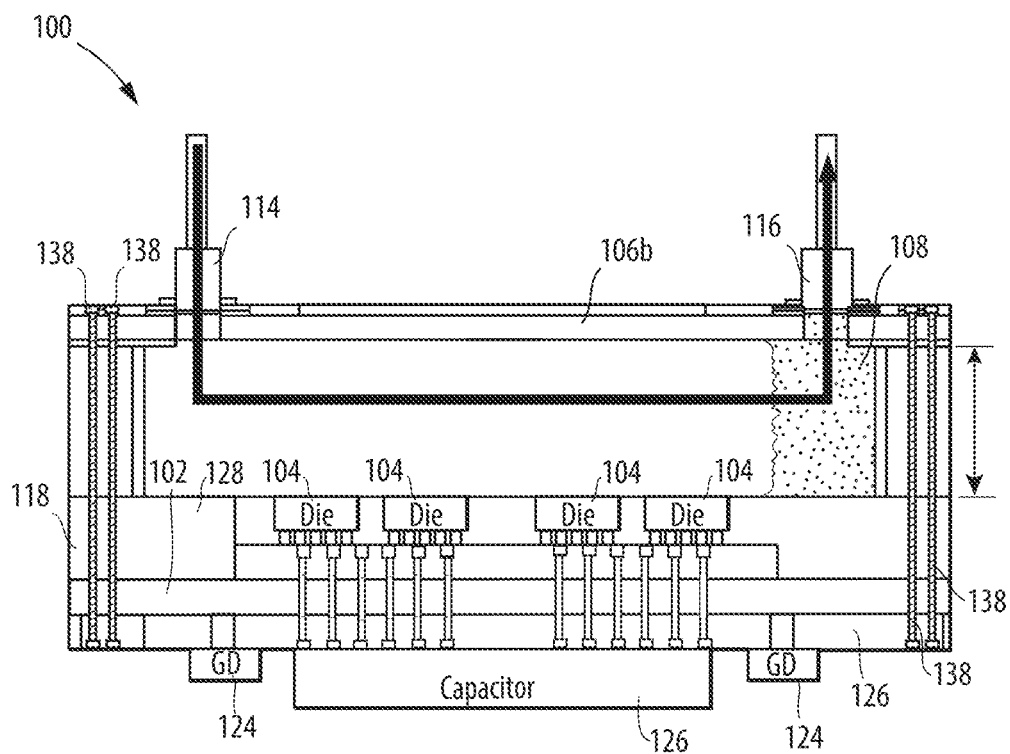
FIG. 7 is a schematic cross-sectional side elevation view of the embedded PCB with micro immersion cooling channel of FIG. 5, showing embedded dies in the first PCB in direct contact with coolant in the cooling path.
Figure 8:
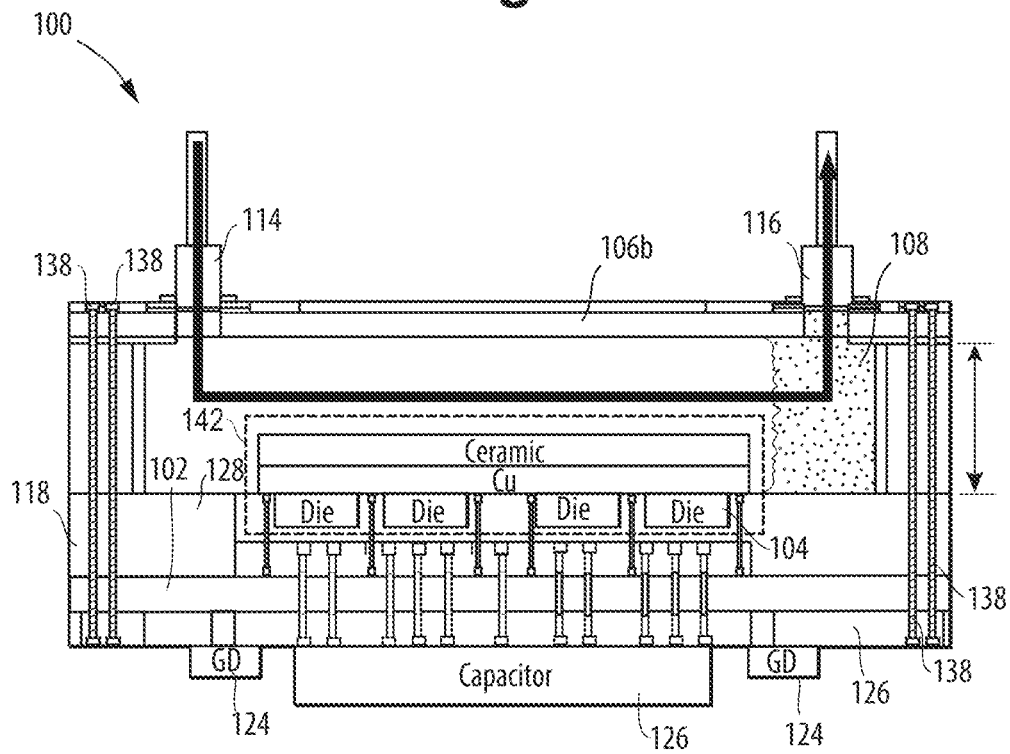
FIG. 8 is a schematic cross-sectional side elevation view of the embedded PCB with micro immersion cooling channel assembly of FIG. 5, showing embedded dies in the first PCB with a direct bonded coper packaging (DBC) intervening between the dies and direct fluid commination with the cooling path.

In FIGS. 1-5, each of the heat generating components 104 includes a die, e.g. wide band gap or silicon MOSFET, such as a Gallium Nitride (GaN) transistor or the like, inside a package, wherein the die generates heat, and wherein the package is in direct fluid communication with the cooling path 108. However, any other suitable type of heat generating component is also contemplated. In FIG. 6, each heat generating element 104 includes a die in direct fluid communication with the cooling path without an intervening package. Similarly, in FIG. 7, the heat generating elements are dies embedded in the first PCB 102 with just an outer surface of the dies exposed to fluid communication with the cooling path 108. In FIG. 8, the dies of the heat generate components 104 are embedded in the PCB 102 with a direct bonded coper (DBC) packaging 142 intervening between the dies and direct fluid commination with the cooling path 108. For FIGS. 1-5 and 8, the coolant in the cooling path 108 can be conductive or a dielectric coolant in the cooling path. Where dies are exposed directly to coolant such as in FIGS. 6-7, a dielectric coolant can be used.

The thermal expansion and contraction related to PCB's and their constituent components in assemblies as disclosed herein is acceptable even when using cryogenic coolant and non-conductive fluid in cycles. The sealing between PCB layers can take into account leak stopper and seal material property factors such as spring force, surface finish, friction and allowable leakage.

Systems and method as disclosed herein can provide potential benefits such as the following. Relative to traditional systems, they can allow for increasing package power density, low total package power dissipation, less thermal cross-talk by target immersion cooling. Direct immersion cooing can allow fast response time, for easy device case/junction temperature control, and for low temperature differential between the coolant and a GaN device, for example. Systems and methods herein allow for dispensing with the conventional cold plate. No thermal interface material and thermal insulation are necessarily required. There need be no surface flatness and overall warpage impact. There need be no interposer thermal conductivity. There need be no glass and Silicon (Si) interposer performance issues. There can be less thermal impact at the other devices than in more conventional approaches.

The methods and systems of the present disclosure, as described above and shown in the drawings, provide for cooling, including cryogenic and non-conductive fluid cooling, to electronic devices. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. An embedded printed circuit board (PCB) assembly comprising:
   a first PCB including at least one heat generating component;
   a cooling path extending in a coolant flow direction from an inlet end of the cooling path to an outlet end of the cooling path, wherein the cooling path is in fluid communication with the at least one heat generating component;
   a second PCB defining a perimeter wall about the cooling path, the second PCB sealed to the first PCB;
   a third PCB including an inlet and an outlet for the cooling path, the third PCB sealed to the second PCB, the cooling path defined in an interior space bounded by the first, the second, and the third PCBs; and
   one or more vias extending from an exterior surface of the third PCB, through the third PCB, through the second PCB, and through the first PCB to an exterior surface of the first PCB.

2. The assembly as recited in claim 1, wherein at least one of the second PCB and the third PCB forms a lid, and wherein the lid defines the cooling path.

3. The assembly as recited in claim 2, wherein the lid includes a unitary polymer element defining the inlet and the outlet for the cooling path.

4. The assembly as recited in claim 3, wherein the lid is joined to the first PCB with one or more fasteners.

5. The assembly as recited in claim 4, wherein the one or more fasteners each extend through the first PCB and into the lid.

6. The assembly as recited in claim 2, wherein the lid includes electronic devices mounted thereto.

7. The assembly as recited in claim 1, wherein:
   the second PCB is sealed to the first PCB with a first seal element; and
   the third PCB is sealed to the second PCB with a second seal element.

8. The assembly as recited in claim 7, wherein the first and the second seal elements are laser cut.

9. The assembly as recited in claim 7, wherein the first and the second seal elements include Indium.

10. The assembly as recited in claim 1, wherein:
    the at least one heat generating component includes a die inside a package;
    the die is configured to generate heat; and
    the package is in direct fluid communication with the cooling path.

11. The assembly as recited in claim 1, wherein the at least one heat generating component includes a die in direct fluid communication with the cooling path without an intervening package.

12. The assembly as recited in claim 11, wherein the die is embedded in the first PCB.

13. The assembly as recited in claim 1, wherein the at least one heat generating component includes a die embedded in the first PCB with a direct bonded copper (DBC) packaging intervening between the die and direct fluid communication with the cooling path.

14. The assembly as recited in claim 1, wherein the first PCB includes an electronic device mounted to an external surface thereof, opposite an interior surface of the first PCB that bounds the cooling path.

15. The assembly as recited in claim 14, wherein the electronic device mounted to the external surface includes a capacitor.

16. The assembly as recited in claim 14, wherein the electronic device mounted to the external surface is electrically connected to the at least one heat generating component.

17. The assembly as recited in claim 16, wherein the one or more vias through the first PCB electrically connect the at least one heat generating component to the electronic device mounted to the external surface.

18. The assembly as recited in claim 1, further comprising a cryogenic and non-conductive fluid coolant in the cooling path.

19. An embedded printed circuit board (PCB) assembly comprising:
    a first PCB with an embedded electronics device PCB packaging and including at least one heat generating component;
    a cooling path extending in a coolant flow direction from an inlet end of the cooling path to an outlet end of the cooling path, wherein the cooling path is in fluid communication with the at least one heat generating component;
    a second PCB defining a perimeter wall about the cooling path, which includes a micro cooling channel;
    a third PCB that includes an inlet and an outlet for the cooling path, wherein the second PCB is sealed with a first seal element to the first PCB, wherein the third PCB is sealed to the second PCB with a second seal element, and wherein the cooling path is defined in an interior space bounded by the first, the second, and the third PCBs; and one or more vias extending from an exterior surface of the third PCB, through the third PCB, through the second PCB, and through the first PCB to an exterior surface of the first PCB.

20. The assembly as recited in claim 19, wherein the third PCB includes a unitary polymer element defining the inlet and the outlet for the cooling path.

21. The assembly as recited in claim 19, wherein the first and the second seal elements include Indium.

\* \* \* \* \*